United States Patent
Tsai et al.

(10) Patent No.: US 8,008,100 B2
(45) Date of Patent: Aug. 30, 2011

(54) LIGHT EMITTING DIODE PACKAGE STRUCTURE AND MANUFACTURING METHOD THEREFOR

(75) Inventors: Chih-Chia Tsai, Shulin (TW); Cheng-Yi Chang, Chung Ho (TW); Ming-Kuei Lin, Tu Chen (TW)

(73) Assignee: Everylight Electronics Co., Ltd., New Taipei (TW)

( * ) Notice: Subject to any disclaimer, the term of this patent is extended or adjusted under 35 U.S.C. 154(b) by 262 days.

(21) Appl. No.: 12/398,174

(22) Filed: Mar. 4, 2009

(65) Prior Publication Data

US 2009/0224280 A1 Sep. 10, 2009

(30) Foreign Application Priority Data

Mar. 4, 2008 (TW) ................ 97107548 A

(51) Int. Cl.
*H01L 21/00* (2006.01)

(52) U.S. Cl. ............ 438/27; 438/29; 438/112; 438/118; 438/126; 438/127; 257/E33.056; 257/E33.059; 257/E33.066; 257/E21.502

(58) Field of Classification Search .................. 438/26, 438/27–29, 34, 111, 112, 116, 118, 125–127; 257/668, 676, 687, 690, 701, 735, 788, 791, 257/793, E21.499, E21.502, E33.056, E33.059, 257/E33.066
See application file for complete search history.

(56) References Cited

U.S. PATENT DOCUMENTS

| 5,998,862 | A * | 12/1999 | Yamanaka | 257/704 |
| 6,878,971 | B2 * | 4/2005 | Uemura | 257/98 |
| 2004/0211968 | A1 * | 10/2004 | Lin et al. | 257/81 |
| 2009/0026484 | A1 * | 1/2009 | Hsu et al. | 257/99 |

FOREIGN PATENT DOCUMENTS

CN 2831445 Y 10/2006

* cited by examiner

*Primary Examiner* — Matthew C. Landau
*Assistant Examiner* — Joseph C Nicely
(74) *Attorney, Agent, or Firm* — Pai Patent & Trademark Law Firm; Chao-Chang David Pai

(57) ABSTRACT

A light emitting diode (LED) package and a manufacturing method therefore are disclosed. The LED package comprises: a transparent substrate, a transparent LED chip, a transparent adhesive for bonding the transparent LED chip, a lead frame, conductive wires, and an encapsulant. In the manufacturing method, a heating step is first performed to heat a first transparent plastic material to be a sticky member. Thereafter a connecting step is performed to connect the lead frame to the sticky member. Then a chip-bonding step is performed to bond the LED chips on the sticky member. Thereafter a wire-bonding step is performed to electrically connect the transparent LED chip to the lead frame. Then an encapsulating step is performed to encapsulate the transparent LED chips with a second transparent plastic material. Thereafter a drying step is performed to form the shapes of the sticky member and the second transparent plastic material.

5 Claims, 5 Drawing Sheets

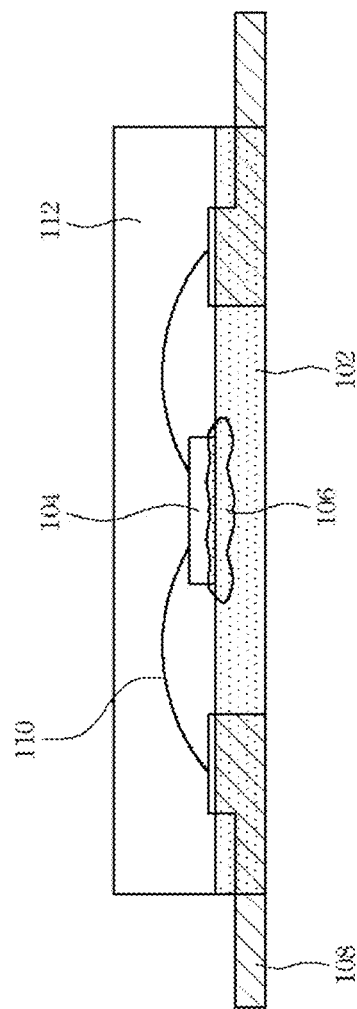
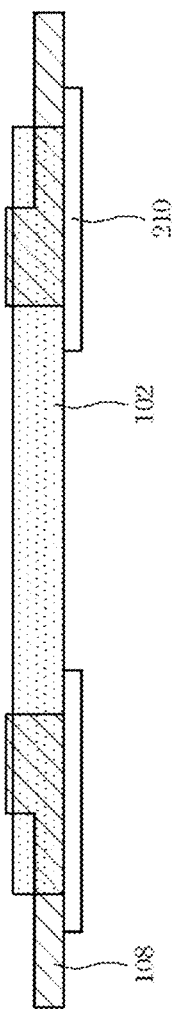

LIGHT EMITTING DIODE PACKAGE STRUCTURE AND MANUFACTURING METHOD THEREFOR

RELATED APPLICATIONS

This application claims priority to Taiwan Application Serial Number 97107548, filed Mar. 4, 2008, which is herein incorporated by reference.

FIELD OF THE INVENTION

This invention relates to a (LED) package structure and a manufacturing method therefor, and more particularly, to a transparent LED package structure and a manufacturing method therefor.

BACKGROUND OF THE INVENTION

With the advance of science and technologies, various types of advertising signboards are developed, and an LED advertising signboard is one of the most popular advertising signboards. In general, advertising signboards are mounted on elevated and noticeable areas or people crowded areas, and thus the advertising signboards are often mounted on the glass curtain walls of high-rise buildings. However, since an LED advertising signboard is generally composed of a plurality of LED units through which very few light is allowed to pass, the LED advertising signboard will block the ambient light passing through a glass curtain wall of a building when being mounted on the glass curtain wall, so that the light cannot enter the building from outdoors.

SUMMARY OF THE INVENTION

Therefore, an aspect of the present invention is to provide a transparent LED package structure and a manufacturing method therefor, thereby overcoming the aforementioned problems.

According to an embodiment of the present invention, the transparent LED package comprises a transparent substrate, at least one LED chip, a lead frame, a plurality of conducting wires, and an encapsulant. The LED chip is disposed on the transparent substrate. The lead frame is used to hold the transparent substrate. The conducting wires are used to electrically connect the LED chip to the lead frame. The encapsulant is used to encapsulate the LED chip.

According to another embodiment of the present invention, in the manufacturing method, a heating step is first performed to heat a first transparent plastic material to be a sticky member. Then, a connecting step is performed to connect a lead frame to the sticky member. Thereafter, a chip-bonding step is performed to use a transparent chip-bonding glue to bond at least one transparent LED chip on the sticky member. Then, a wire-bonding step is performed to electrically connect the at least one transparent LED chip to the lead frame. Thereafter, an encapsulating step is performed to encapsulate the at least one transparent LED chip with a second transparent plastic material. Then a drying step is performed to form the sticky member and the second transparent plastic material into shape.

According to another embodiment of the present invention, the manufacturing method further comprises a solder resisting step for coating a solder mask on the bottom side of the lead frame.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A-FIG. 1F are cross sectional schematic diagrams showing a flow process for manufacturing a transparent LED package structure according to a first embodiment of the present invention;

DETAILED DESCRIPTION OF THE PREFERRED EMBODIMENT

In order to make the illustration of the present invention more explicit and complete, the following description is stated with reference to FIG. 1a through FIG. 3.

First Embodiment

Figure 1A:
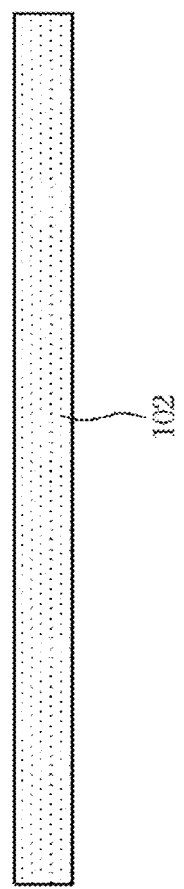
Figure 1B:
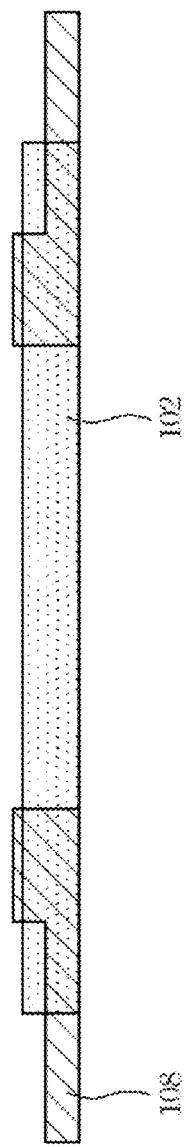
Figure 1C:
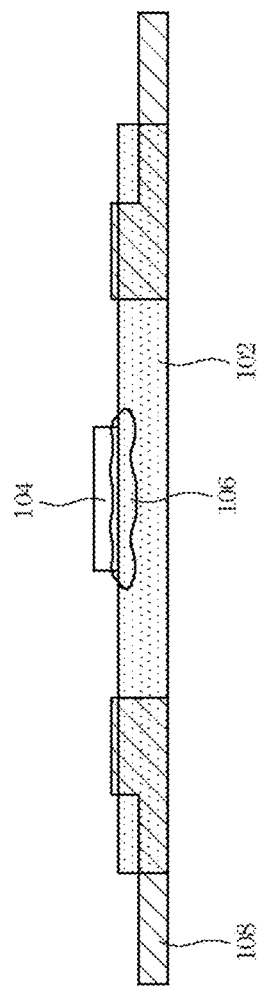
Figure 1D:
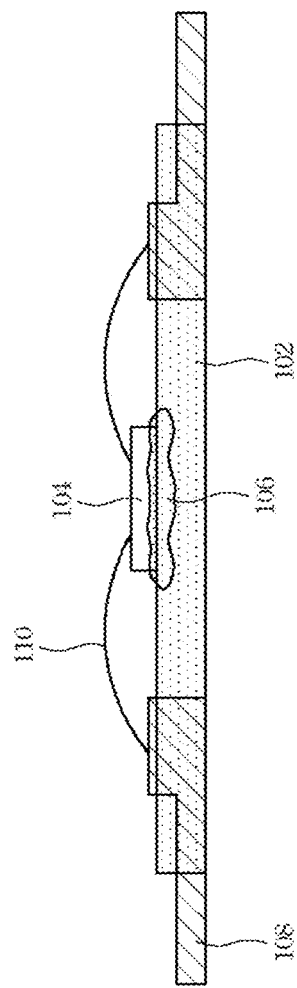
Figure 2:
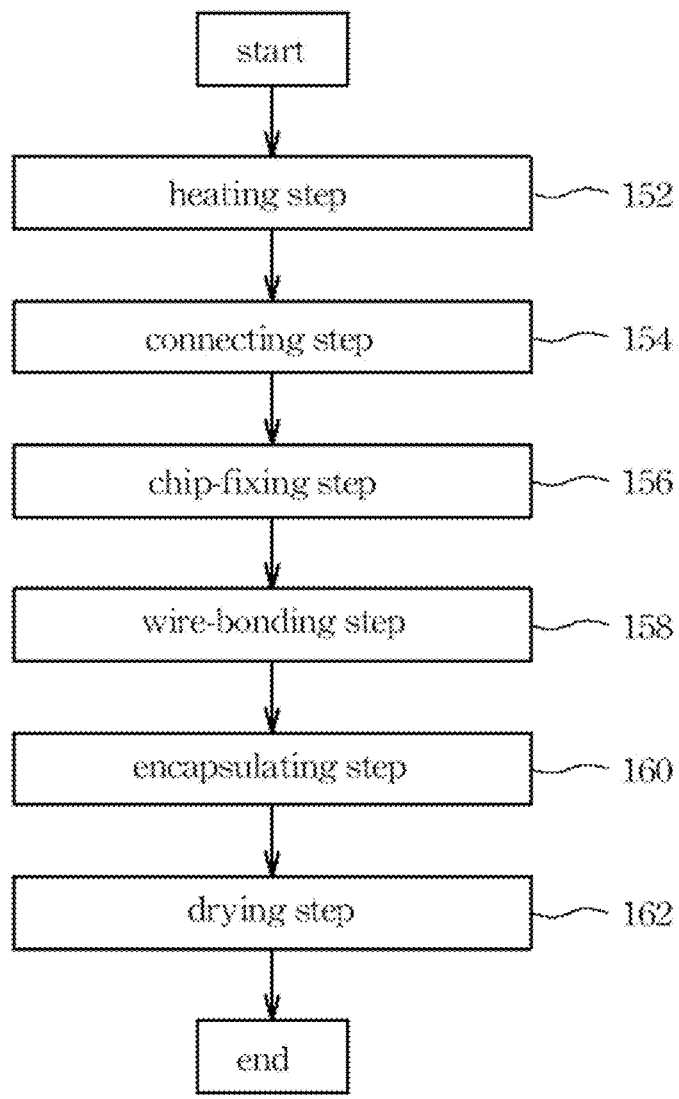
FIG. 2 is a schematic flowchart showing the manufacturing method according to the first embodiment of the present invention.

Referring to FIG. 1A to FIG. 1E, and FIG. 2, wherein FIG. 1A to FIG. 1E are cross sectional schematic diagrams showing a manufacturing method of a light emitting diode (LED) package structure according to a first embodiment of the present invention; and FIG. 2 is a schematic flowchart showing the manufacturing method according to the first embodiment of the present invention. Please refer to FIGS. 1A and 2, in the manufacturing method 150, a heating step 152 is first performed to heat a first transparent plastic material to be a sticky member 102, and the sticky member 102 is used as a substrate in the transparent LED package. In this embodiment, epoxy or silicone material is placed on a processing stage to form a board, and then the board is heated. It is noted that the sticky member 102 is transparent. A connecting step 154 is then performed, and a lead frame 108 is placed on the sticky member 102 so as to be connected with the sticky member 102, such as shown in FIG. 1B and FIG. 2. Thereafter, a chip-bonding step 156 is performed for using transparent chip-bonding glue 106 to bond a transparent LED on the sticky member 102, such as shown in FIG. 1C and FIG. 2. A wire-bonding step 158 is then performed for electrically connecting the lead frame 108 to the transparent LED 104, such as shown in FIG. 1D and FIG. 2. Thereafter, an encapsulating step 160 is performed, wherein a second transparent plastic material 112 is used to encapsulate the transparent LED 104 to increase the brightness of the transparent LED 104, such as shown in FIG. 1E and FIG. 2. A drying step 162 is then performed, wherein the sticky member 102 and the second transparent plastic material 112 are dried to form a transparent substrate and an encapsulant, such as shown in FIG. 1E and FIG. 2.

In the structure of the transparent LED package according to the first embodiment of the present invention, the area occupied by the lead frame 108 is very small, so that the LED package can be a transparent structure. In addition, when the material of the second transparent plastic material is the same with that of the first transparent plastic material, the drying step can be simplified, and the manufacturing method can be speeded up thereby.

Second Embodiment

Figure 3:
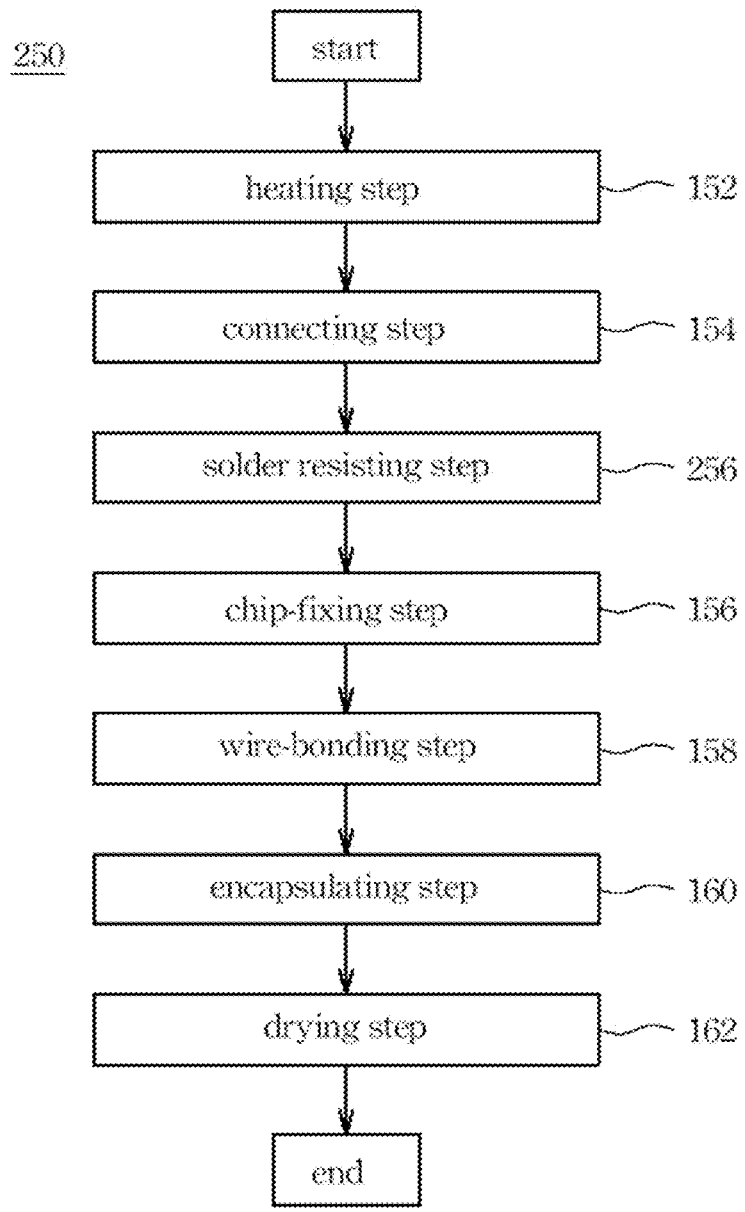
FIG. 3 is a schematic flow chart showing a manufacturing method according to a second embodiment of the present invention.

Referring to FIG. 3. FIG. 3 is a schematic flow chart showing a manufacturing method according to a second embodiment of the present invention. The manufacturing method 250 is similar to the manufacturing method 150, but the difference is in that the manufacturing method 250 further comprises a solder resisting step 264. Referring to FIG. 1F. FIG. 1F is a cross section diagram shows a transparent LED package structure in the solder resisting step 264. In the solder resisting step 264, solder mask 210 is coated on the bottom side of the lead frame 108 to prevent from defects produced in a soldering step. The soldering step may be performed for connecting the transparent LED package to an electronic device. In addition, the solder resisting step is performed between the connecting step 154 and the chip-bonding step 156 in this embodiment. However, the sequence for performing the solder resisting step 264 in the manufacturing method 250 is not limited thereto.

As is understood by a person skilled in the art, the foregoing embodiments of the present invention are strengths of the present invention rather than limiting of the present invention. It is intended to encapsulate various modifications and similar arrangements included within the spirit and scope of the appended claims, the scope of which should be accorded the broadest interpretation so as to encompass all such modifications and similar structures.

What is claimed is:

1. A manufacturing method of a light emitting diode package, comprising:

heating a first transparent plastic material to be a sticky member;

connecting a lead frame to the sticky member;

performing a chip-bonding step to bond at least one transparent light-emitting diode chip on the sticky member using a transparent glue;

performing a wire-bonding step to electrically connect the at least one transparent light-emitting diode chip to the lead frame;

encapsulating the at least one transparent light-emitting diode chip with a second transparent plastic material; and performing a drying step to form the sticky member and the second transparent plastic material into shape.

2. The manufacturing method as claimed in claim 1, wherein the material forming the first transparent plastic material is epoxy or silicone.

3. The manufacturing method as claimed in claim 1, wherein the material of the second transparent plastic material comprises epoxy or silicone.

4. The manufacturing method as claimed in claim 1, wherein the second transparent plastic material and the first transparent plastic material are formed from the same material.

5. The manufacturing method as claimed in claim 1, further comprising:

performing a solder resisting step for coating a solder mask on the bottom side of the lead frame.

\* \* \* \* \*